(12) United States Patent
Inoue et al.

(10) Patent No.: US 7,166,901 B2
(45) Date of Patent: Jan. 23, 2007

(54) SEMICONDUCTOR DEVICE

(75) Inventors: Naoto Inoue, Chiba (JP); Hitomi Sakurai, Chiba (JP); Min Paek, Kedah (MY); Sang Yeon Kim, Kedah (MY); In Ki Kim, Kedah (MY)

(73) Assignees: Seiko Instruments Inc. (JP); Silterra Malaysia Sdh. Bhd (MY)

( * ) Notice: Subject to any disclaimer, the term of this patent is extended or adjusted under 35 U.S.C. 154(b) by 10 days.

(21) Appl. No.: 10/950,828

(22) Filed: Sep. 27, 2004

(65) Prior Publication Data

US 2005/0116265 A1    Jun. 2, 2005

(51) Int. Cl.
*H01L 29/00* (2006.01)

(52) U.S. Cl. .................. 257/501; 257/500; 257/510; 438/199; 438/218

(58) Field of Classification Search ............ 257/510, 257/288, 500, 501; 438/199, 218–225
See application file for complete search history.

(56) References Cited

U.S. PATENT DOCUMENTS 6,451,640 B1 *  9/2002  Ichikawa .................. 438/199
6,646,303 B2 * 11/2003  Satoh et al. .............. 257/321
2003/0199133 A1 * 10/2003  Rodder et al. ............ 438/200
2004/0256658 A1 * 12/2004  Park et al. ................ 257/315
2005/0035394 A1 *  2/2005  Mori ....................... 257/314
2005/0045983 A1 *  3/2005  Noda et al. ............... 257/500

* cited by examiner

*Primary Examiner*—Thao X. Le
*Assistant Examiner*—Abul Kalam
(74) *Attorney, Agent, or Firm*—Adams & Wilks

(57) ABSTRACT

A semiconductor device comprises a semiconductor substrate having a high voltage region and a low voltage region, at least a pair of adjacent high voltage MOS transistors disposed on the high voltage region of the semiconductor substrate, and low voltage MOS transistors disposed on the low voltage region of the semiconductor substrate. A first element isolator comprises a first shallow trench disposed on a surface of the low voltage, region of the semiconductor substrate, and a first dielectric embedded in the first shallow trench. A pair of second element isolators comprises two second shallow trenches spaced apart at an interval between a source region or a drain region of the pair of the adjacent high voltage MOS transistors and a source or a drain region of the other of the pair of the adjacent high voltage MOS transistors, and a second dielectric embedded in each of the second shallow trenches. The second shallow trenches are disposed on a surface of the high voltage region of the semiconductor substrate. A channel cut region having a high impurity concentration is disposed on the surface of the substrate between the second shallow trenches.

14 Claims, 10 Drawing Sheets

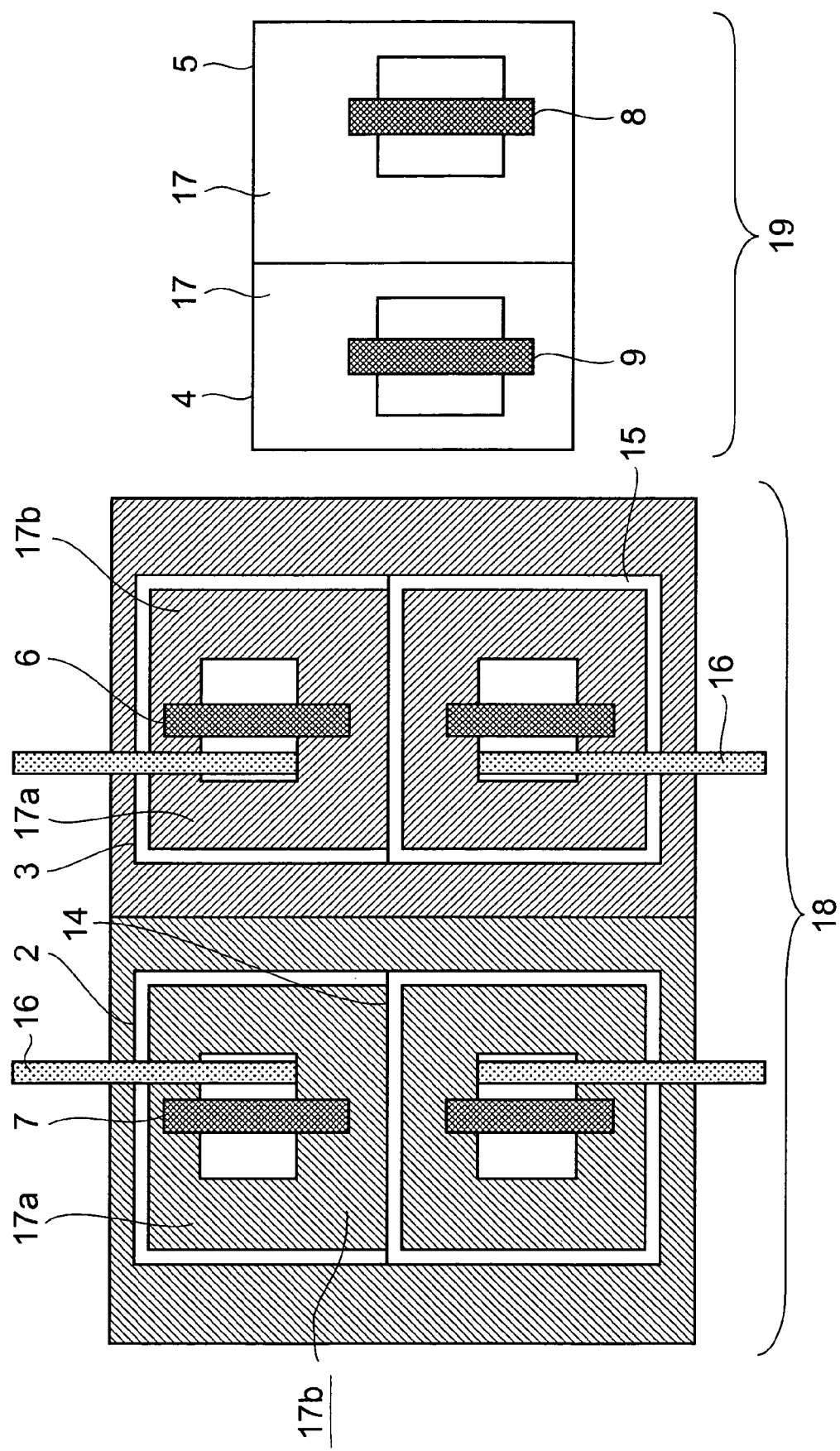

SEMICONDUCTOR DEVICE

BACKGROUND OF THE INVENTION

1. Field of the Invention

The present invention relates to a semiconductor device in which high voltage MOS (hereinafter referred to as HVMOS) transistors and low voltage MOS (hereinafter referred to as LVMOS) transistors are mixedly mounted and formed on the same semiconductor substrate. HVMOS transistors are transistors normally used for driving liquid crystal display devices or thermal heads, and their operation voltage and output voltage are from 8 V to 50 V. Further, LVMOS transistors normally refer to transistors having a gate length in a sub-micron order, which are manufactured with a process rule of 0.25 μm or less, their operation voltage is on the order of 0.9 to 3.3 V, and they are applied in memory and logic circuits.

2. Description of the Related Art

In conventional techniques, element isolators are formed in order to isolate mutually adjacent transistors when a plurality of high voltage (HV) MOS transistors are formed on the same substrate. Parasitic transistors are generally formed by source regions or drain regions formed while being sandwiched between element isolators, and wirings formed on the element isolators. In particular, parasitic transistors are easily formed, and easily operated, in wirings used for HVMOS transistor regions because a high voltage is normally applied.

In particular, it is necessary to increase the threshold voltage of the parasitic MOS transistors formed in the HVMOS transistor formation regions for cases in which the high voltage (HV) MOS transistors and microscopic low voltage (LV) MOS transistors are mixedly mounted. Formation of an inverted region that becomes a channel between a source and a drain in the parasitic MOS transistors, at a voltage equal to or less than the operation voltage of the HVMOS transistors, can thus be prevented. Further, punch-through can be prevented by increasing the distance between the source and the drain of the parasitic MOS transistors, thus ensuring isolation between the elements. Specifically, Locos, recently an STI (shallow trench isolation) structure, or the like is used for the isolation in order to increase the threshold voltage of the parasitic MOS transistors, and doping (field doping) of an impurity used under an additionally thick (field) oxide film is performed, which functions as a channel stopper.

A conventional technique for a case of performing element isolation using a Locos field oxide film 103 having a film thickness from 4000 Å to 6000 Å and formed on an Si substrate 1 is shown in FIG. 8A (for example, refer to JP 9-312399 A (p. 20, FIG. 3)). For a parasitic transistor, low impurity concentration source and drain regions 31 existing in two HVMOS transistors that are mutually isolated by the Locos field oxide film 103, a wiring 16, and an interlayer insulating film 37 corresponding to a gate insulating film of the parasitic MOS transistor, are formed. A field-dope region 104, which is a high impurity concentration impurity region having the same conductivity type as the substrate, is then formed by ion injection directly under a channel region of the parasitic MOS transistor, that is, directly under the field oxide film 103, in order to prevent inversion (channel formation).

A conventional technique is shown in FIG. 8B for a case of performing element isolation by an STI (shallow trench isolation) 17 having an oxide film with a film thickness on the order of 3000 Å and formed on the Si substrate 1 as a field oxide film (for example, refer to JP 10-27840 A (p. 5, FIG. 1B)). Similar to FIG. 8A, the elements are isolated by the STI 17 instead of the Locos formed between two mutually separated HVMOS transistors. The field-doped region 104 having a very high impurity concentration of an impurity element is formed by ion injection into a channel region formed directly under the STI 17. That is, the STI 17 is formed by forming a shallow trench 17*a* on a surface of the Si substrate 1, and embedding a dielectric film 17*b*, which is an oxide film, in the trench. In addition, the field dope region 104', in which a large amount of an impurity having the same conductivity type as the impurity of the Si substrate is introduced, is normally formed directly under the oxide film.

The threshold voltage of the parasitic transistor must be increased, depending on the voltage used, for cases of forming high voltage MOS transistors by the conventional element isolation method shown in FIGS. 8A and 8B. If a high voltage is used, the field oxide film 103, which corresponds to the gate oxide film of the parasitic transistor formed between the HVMOS transistors, must be made thick, or the (high) impurity (field) doped region 104, which is used as a channel stopper, must be introduced in the channel region directly under the field oxide film of the parasitic transistor.

If the Locos field oxide film 103 of the HVMOS transistor portion is made thick, the element isolators of the mixedly mounted low voltage (LV) MOS transistor portion also come to use the thick field oxide film 103 from the view point of manufacturing steps. In addition, a large area is necessary for the element isolators used with the Locos because of the Locos bird's beak region, and it is difficult to mount them mixedly with the LVMOS transistors having gate lengths in a sub-micron order compactly.

Further, the distance between regions doped with the impurity at a low impurity concentration must be increased due to the reduction of the junction withstand voltage when the concentration of the doped impurity used for a channel stopper is high, and the area of the high voltage MOS transistor formation region is increased.

SUMMARY OF THE INVENTION

According to the present invention, two STIs are formed as element isolators between two adjacent HVMOS transistors and a channel (formation) region (active region) of a parasitic MOS transistor sandwiched between the two STIs is taken as an Si substrate surface, and an impurity (impurity having the same conductivity type as an impurity of the Si substrate) is doped in the channel formation region as a channel stopper. Through the doping, a high impurity concentration impurity can be doped at the same time as formation of sources and drains of the HVMOS transistors and LVMOS transistors.

Impurity formation is not only performed for channel stopper in the present invention (at the same time as source and drain formation), and therefore manufacturing processes can be simplified. Further, one STI element isolator can be used as an element isolator for microscopic transistors of an LVMOS transistor region, and therefore it is possible to compactly mount them mixedly with the LVMOS transistors having a gate length in the sub-micron order.

BRIEF DESCRIPTION OF THE DRAWINGS

In the accompanying drawings:

FIG. 2 is a plan view of main parts of the embodiment of FIG. 1 of the present invention;

DETAILED DESCRIPTION OF THE PREFERRED EMBODIMENTS

Figure 1:
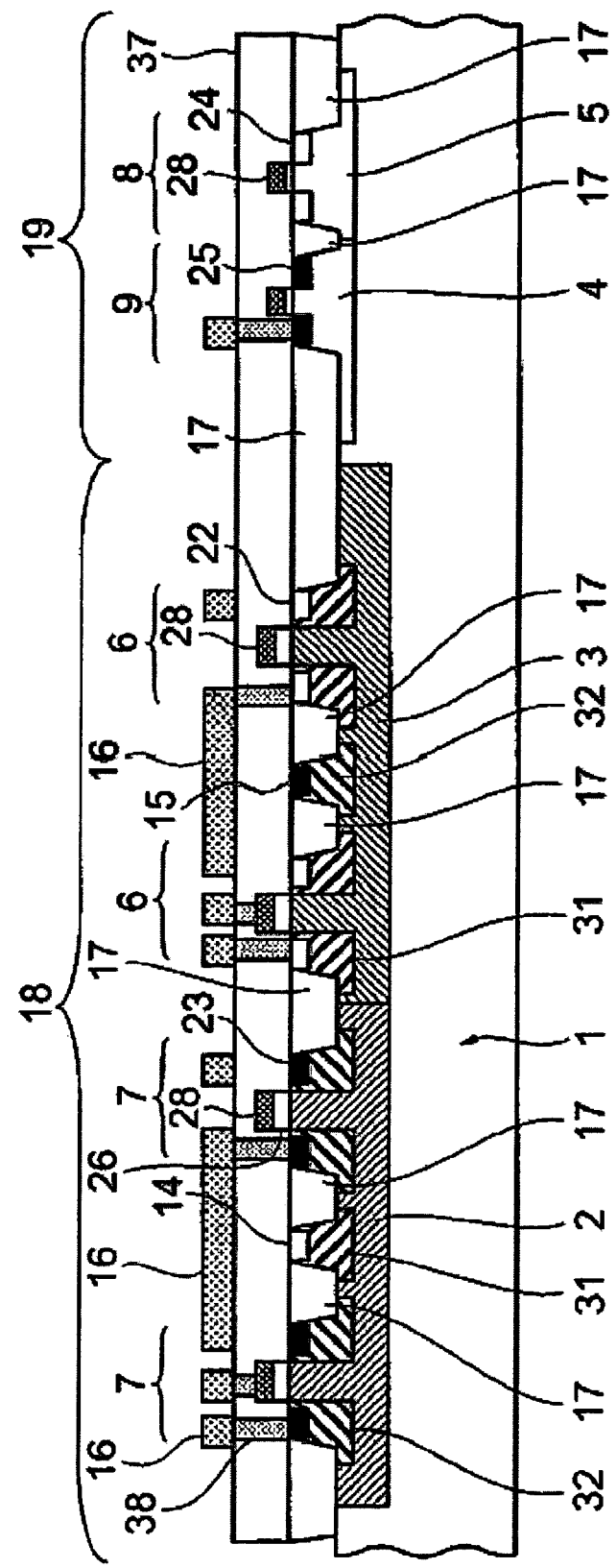
FIG. 1 is a cross sectional diagram of a structure of an embodiment of the present invention.

FIG. 1 is a cross sectional diagram of a structure of an embodiment of the present invention and the embodiment will be explained below. An HVNwell 2 and an HVPwell 3 formed within an HV region 18 for forming a high voltage (HV) MOS transistor, and an LVNwell 4 and an LVPwell 5 formed within an LV region 19 for forming an LVMOS transistor, are disposed on an Si substrate 1. Elements are isolated within each of the HVPMOS and HVNMOS transistor element formation regions 18 by two STIs 17. Elements are isolated with each of the LVPMOS and LVNMOS transistor element formation regions 19 by the one STI 17.

The HVNwell 2 is an HVMOS formation region, and an n-type conductivity impurity region. The HVPwell 3 is an HVMOS formation region, and a p-type conductivity impurity region. The LVNwell 4 is an LVMOS formation region, and an n-type conductivity impurity region. The LVPwell 5 is an LVMOS formation region, and a p-type conductivity impurity region.

A plurality of p-channel HVMOS (HVPMOS) transistors 7 are formed in the HVNwell 2. The HVPMOS transistors 7 each include an HV gate oxide film 26, a gate electrode 28 formed on the HV gate oxide film, and a p-type low impurity concentration source and drain regions 32 formed on both sides of the gate-electrode 28, and p-type high impurity concentration source and drain regions 23 formed on the outside of the p-type low impurity concentration source and drain regions 32. The HVPMOS transistor 7, which is a high voltage MOS transistor, is formed by forming the p-type low impurity concentration source and drain regions 32. The structure of the high voltage HVPMOS transistors 7 and HVNMOS transistors 6 are not limited to the structure of this embodiment, and other conventional structures may also be used. In addition, an interlayer insulating film 37 is formed on the transistors, and a contact 38 is formed in the interlayer insulating film 37 for connecting a wiring 16 formed thereon to high impurity concentration source and drain regions 23, and the like. This is a general PMOS transistor structure. A tap, which is not shown in the figures, is formed in the HVNwell 2 for fixing the electric potential thereof.

Figure 9:
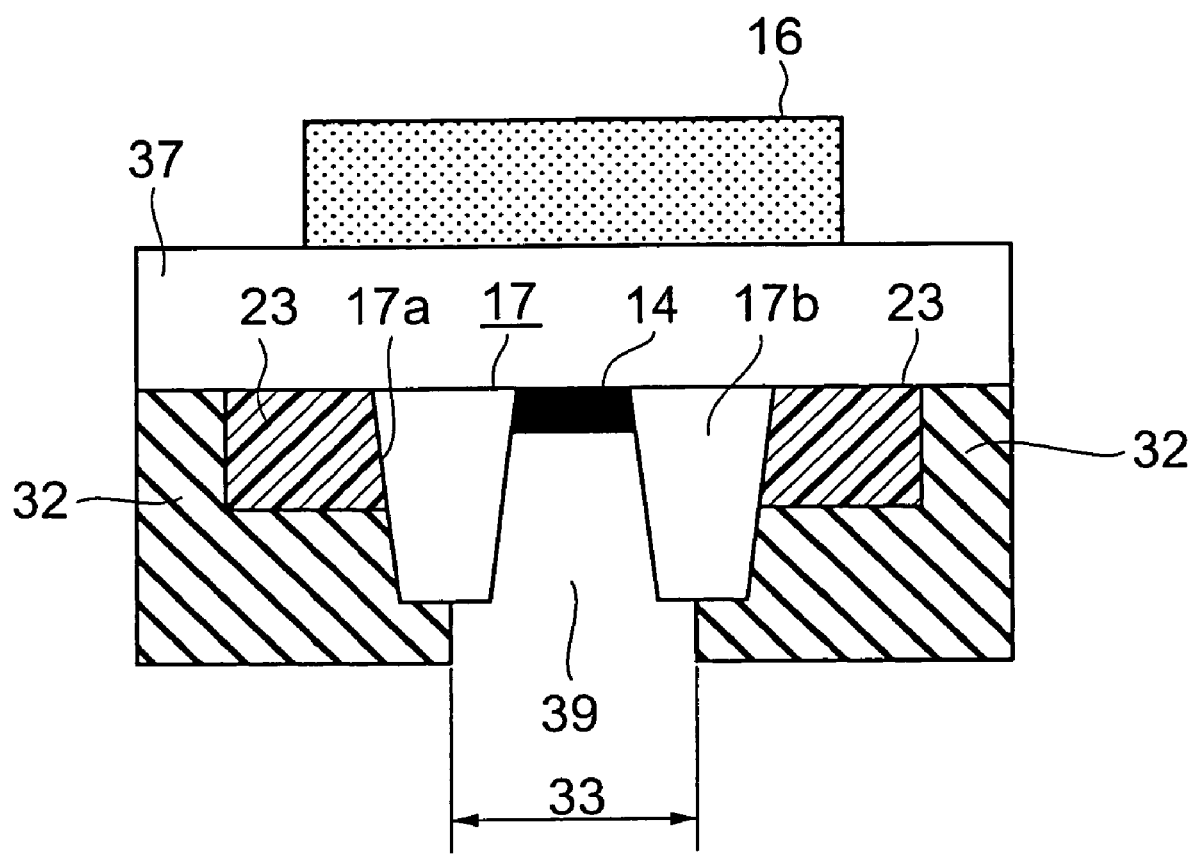
FIG. 9 is a cross sectional diagram of an STI that is a main part of the present invention.

The two STIs 17 are formed with a gap, between two adjacent HVPMOS transistors 7 formed on the surface of the HVNwell 2. Each of the STIs 17 extends longitudinally in a direction orthogonal to the direction in which the two HVPMOS transistors 7 are disposed. FIG. 9 is an enlarged cross-sectional view thereof. The two STIs 17 have the following structure. Two shallow trenches 17a are formed between the two adjacent HVPMOS transistors 7, and dielectrics 17b are embedded in each of the trenches. The dielectrics 17b are normally made of oxide films. High impurity concentration source and drain regions 23 having a p-type conductivity of each of the HVPMOS transistors 7 are formed at both outer sides of the two STIs 17. The shallow trenches 17a each normally contact one of the high impurity concentration source and drain regions 23. A surface of the HVNwell 2 appears between the two shallow trenches 17a. An HVN+ channel cut layer (field dope) 39, which has a relatively low impurity concentration impurity of an n-type conductivity (not shown in the figures), and is formed at the same time as formation of low impurity concentration source and drain regions 31 of the HVNMOS transistor 6 explained later, is formed on the surface of the HVNwell 2 between the two shallow trenches 17a.

In addition, an HVN++ channel cut layer 14, which has a high impurity concentration impurity of an n-type conductivity and is formed at the same time as formation of high impurity concentration source and drain regions 22 of the HVNMOS transistors 6, is formed on the HVN+ channel cut layer 39. Note that the effects of the present invention are obtained even if the HVN+ channel cut layer 39 having a relatively low impurity concentration impurity of an n-type conductivity is not formed. The interlayer insulating film 37 is formed on the STIs 17, and wirings 16 are formed thereon. A high voltage (8 to 50 V) is applied to the wirings 16 because they are used for the HVPMOS transistors 7 and the HVNMOS transistors 6. The HVN++ channel cut layer 14 is formed on the surface of the HVNwell 2 region sandwiched between the two shallow trenches 17a below the wirings 16, to which the high voltage is applied, and therefore the polarity does not invert. That is, the parasitic transistor does not operate.

Referring back to FIG. 1, the plural n-channel HVMOS (HVNMOS) transistors 6 are formed on the surface of the HVPwell 3 region. The HVNMOS transistors 6 have a structure similar to that of the HVPMOS transistors 7, but are structured by elements having different conductivity types. The n-type low impurity concentration source and drain regions 31 of the HVNMOS transistor are formed as a substitute for the p-type low impurity concentration source and drain regions 32 of the HVPMOS transistors 7. N-type high impurity concentration source and drain regions 22 are formed on the n-type low impurity concentration source and drain regions 31 as a substitute for the p-type high impurity concentration source and drain regions 23 of the HVPMOS transistors 7.

In addition, the two STIs 17 are formed between the two HVNMOS transistors 6 in the HVPwell 3. An HVP+ channel cut layer, which has a relatively low impurity concentration impurity of a p-type conductivity and is formed at the same time as formation of the low impurity concentration source and drain regions 31 of the HVPMOS transistors 7, is formed between the two shallow trenches 17a (STIs 17). In addition, an HVP++ channel cut layer 15, which has a low impurity concentration impurity of a p-type conductivity and is formed at the same time as formation of the high impurity concentration source and drain regions 23 of the HVPMOS transistors 7, is formed on the HVP+ channel cut layer. As stated above, it is not necessary to form the HVP+ channel cut layer that has a relatively low impurity concentration impurity of a p-type conductivity.

The interlayer insulating film 37 is formed on the STIs 17, and the wirings 16 are formed on the interlayer insulating film 37. A high voltage (8 to 50 V) is applied to the wirings 16 because they are used for the HVPMOS transistors 7 and the HVNMOS transistors 6. The HVP++ channel cut layer 15 is formed on the surface of the HVNwell 2 region sandwiched between the two shallow trenches 17a, and therefore the polarity of the HVP++ channel cut layer 15 does not invert by applying the high voltage to the wirings 16. That is, the parasitic transistor does not operate. In other words, the element isolators have nearly the same structure as the HVPMOS transistors 7, except for their polarity in conductivity type.

Further, the low voltage MOS transistor formation region 19 is formed on the Si substrate 1. The region 19 includes the LVNwell 4, which is an n-type well region for forming a plurality of low voltage (LV) PMOS transistors 9, and the LVPwell 5, which is a p-type well region for forming a plurality of low voltage (LV) NMOS transistors 8. Computational circuits and logic circuits are structured by this region, and therefore it is not required for the region to have high voltage output.

The plural LVPMOS transistors 9 having p-type high impurity concentration source and drain regions 25 of the LVPMOS transistor are formed in the LVNwell 4. The plural LVNMOS transistors 8 having n-type high impurity concentration source and drain regions 24 are formed in the LVPwell 5. Element isolation between the low voltage MOS transistors having the same conductivity type is achieved by one shallow trench 17a, and the dielectric 17b embedded in the trench 17a. Voltages applied to the wirings 16, which become gate electrodes, are low in the low voltage LVMOS transistors, and therefore element isolation is possible by only the shallow trench 17a and the dielectric 17b embedded therein. Needless to say, element isolators of the LV region 19 may have the same structure as the STI 17, which is the element isolator for the HV region 18. However, in this case there are the two shallow trenches 17a, and therefore the surface area becomes larger.

Figure 8A:
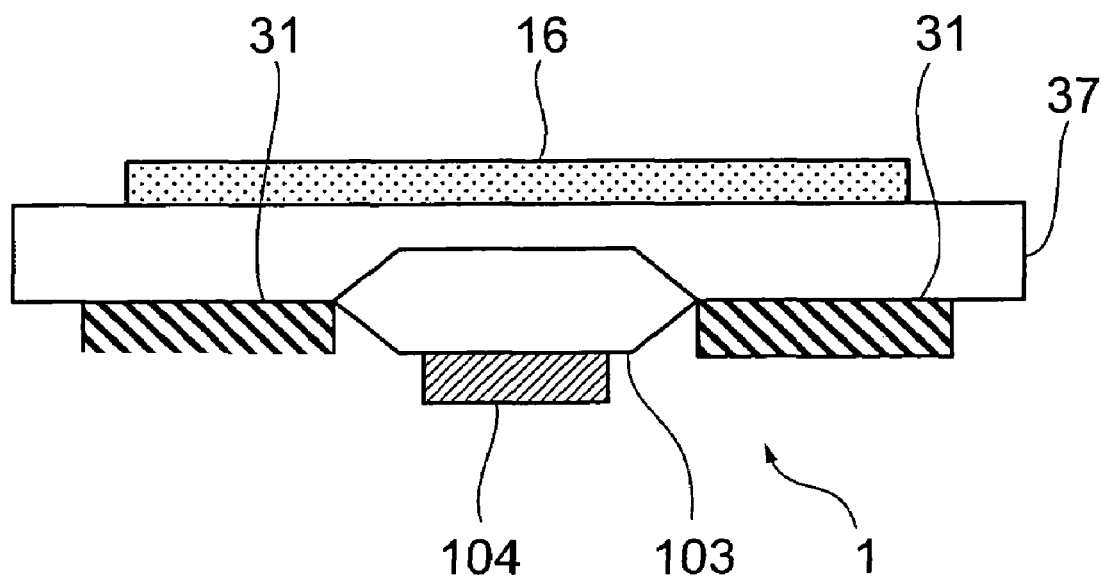
FIGS. 8A and 8B are cross sectional diagrams of a conventional technique.
Figure 8B:
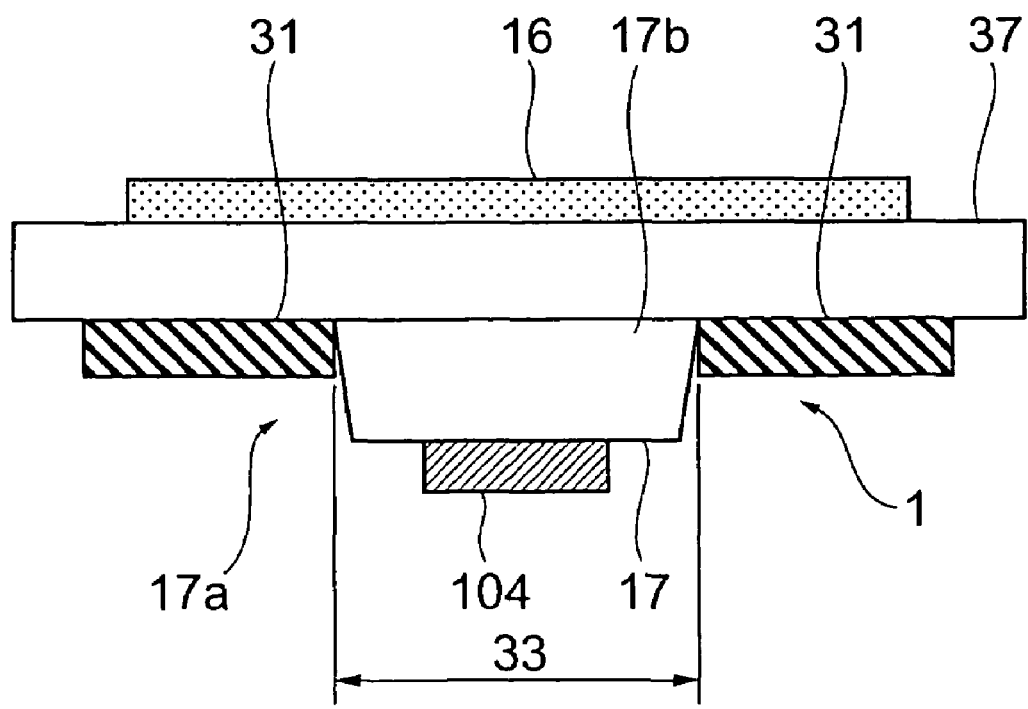
Figure 10:
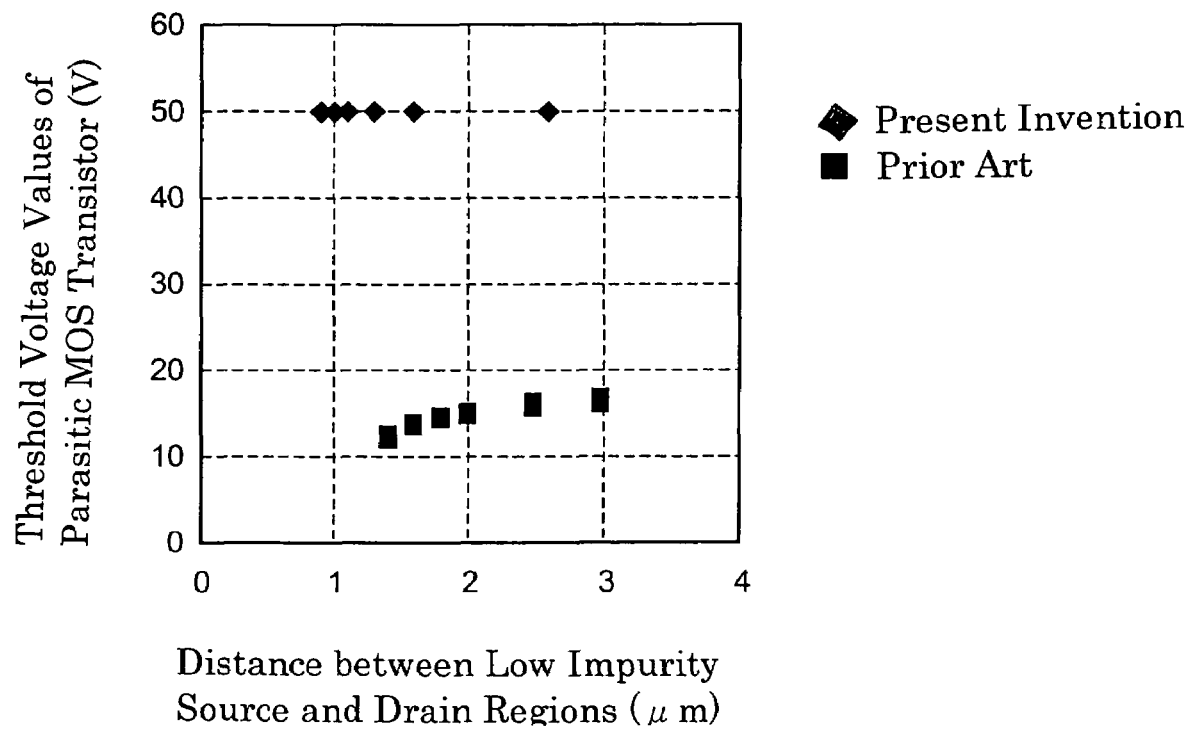
FIG. 10 is a graph in which threshold voltages are compared.

A comparison between the threshold voltage values of parasitic MOS transistor for the conventional technique shown in FIG. 8B and parasitic MOS transistor of the present invention shown in FIG. 9 is shown in FIG. 10. FIG. 10 shows the threshold voltage of this n-type parasitic MOS transistor, with a distance 33 between the source and drain regions of the parasitic MOS transistor taken as a variable. The HVP++ channel cut layer 15, in which an impurity is doped a high impurity concentration, is disposed in the present invention, and therefore the parasitic MOS transistor has a high threshold voltage. A threshold value of 50 V is maintained even if the distance 33 between the p-type high impurity concentration source and drain regions 23 of adjacent HVPMOS transistors 6, or the distance 33 between the n-type high impurity concentration source and drain regions 22 of adjacent HVNMOS transistors 7 (the distance between the source and the drain regions of the parasitic MOS transistor), is equal to or less than 1 μ. The threshold voltage value is on the order of 12 V with the conventional example shown in FIG. 9B.

FIG. 2 is a plan view of main parts of the embodiment explained by using FIG. 1. Note that, the reduction scale differs from that of FIG. 1. The main parts include the HVNwell 2 and the HVPwell 3 formed within the HV region 18 for forming the HVMOS transistors, and the LVNwell 4 and the LVPwell 5 formed within the LV region 19 for forming the LVMOS transistors, which are disposed on the Si substrate 1.

The p-type Si substrate 1 is explained here. The two HVPMOS transistors 7 are drawn in the HVNwell region 2. Two STIs 17 including the two shallow trenches 17a between the two HVPMOS transistors 7, and the dielectrics 17b embedded in the shallow trenches 17a, are formed between the two HVPMOS transistors 7. A surface of the HVNwell region 2 appears between the two STIs 17, and the HVN++ channel cut layer 14 is formed in that surface. Further, the wrings 16 are formed so as to straddle the HVN++ channel cut layer 14.

The HVNMOS transistors 6 and the like are formed in the HVPwell region 3, similar to the above. The HVP++ channel cut layer 15 is formed on a surface between the two STIs 17 in this region. Only the polarity differs with the HVNwell region 2.

The LVPMOS transistors 9 are formed in the LVNwell region 4, and the LVNMOS transistors 8 are formed in the LVPwell region 5. Only one STI 17 is used for the element isolation, in the same manner as the HV region 18 and the LV region 19.

Figure 3A:
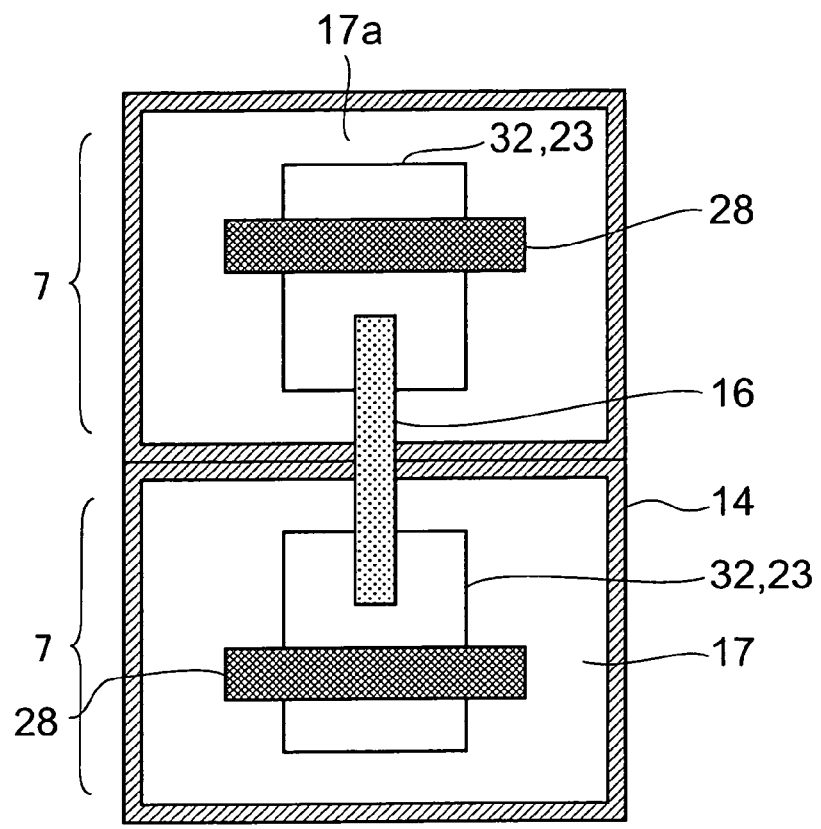
FIGS. 3A and 3B are plan views of main parts of another embodiment of the present invention.
Figure 3B:
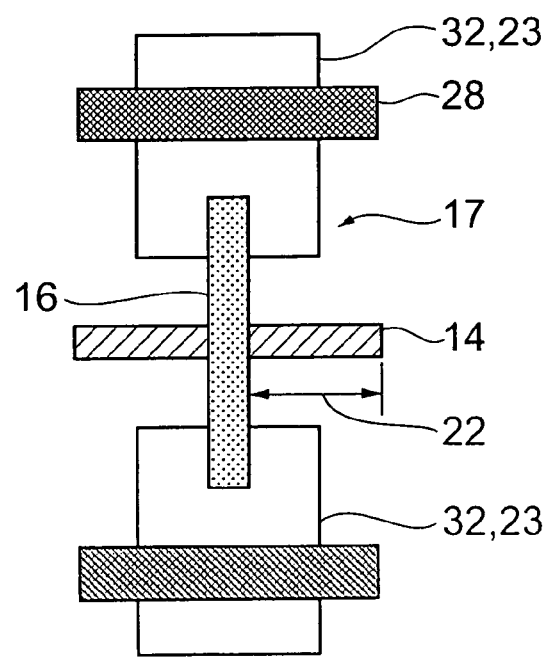

FIGS. 3A and 3B are plan views of another embodiment of the present invention. Adjacent portions of two adjacent HVPMOS transistors 7 or two adjacent HVNMOS transistors 6 are shown. The two HVPMOS transistors 7 formed within the HVNwell2 are drawn in FIG. 3A. The gate electrode 28, and the p-type low impurity concentration source and drain regions 32 of the HVPMOS transistor 7, which are formed on both sides of the gate electrode 28, are formed in each of the HVPMOS transistors 7. The STI 17 surrounds the periphery of the p-type low impurity concentration source and drain regions 32, except for the gate electrode 28 portion of each of the HVPMOS transistors 7. Although not shown in the figures, there are also cases in which the p-type high impurity concentration source and drain regions 23 are formed between the p-type low impurity concentration source and drain regions 32 and the STI 17. The HVN++ channel cut regions 14 are then formed in the periphery of each of the p-type low impurity concentration source and drain regions 32 (and regions including the p-type high impurity concentration source and drain regions which are not shown in the figures), except for the gate electrode 28 portions of the HVPMOS transistors 7, through the STIs 17. That is, the HVN++ channel cut regions 14 are formed so as to surround each of the HVPMOS transistors 7.

The wirings 16 are then formed so as to straddle element isolation portions of the HVPMOS transistors 7 designed to be adjacent, as shown in FIG. 3A. It is generally not necessary that the wirings 16 be electrically connected directly to the gate electrodes 28. The wirings may be formed on the gate electrodes 28 through an intermediate insulating film, and may be formed on the interlayer insulating film 37 so as not to overlap with the gate electrodes 28. That is, the HVPMOS transistors 7 are surrounded by using the HVN++ channel cut regions 14, and channel formation of the parasitic transistor is blocked.

Further, the HVN++ channel cut region 14 may also be disposed only in a portion under the wiring 16, which becomes a channel region of the parasitic MOS transistor, as shown in FIG. 3B. The distance 22 between an end of the HVN++ channel cut region 14 and the wiring 16 at this point is determined by the voltage applied to the wiring 16 and the threshold voltage of the parasitic MOS transistor.

FIGS. 4A to 4D are cross sectional diagrams in a step order of the present invention. A process for a case in which the LVMOS transistors 8 and 9, which have a process rule of 0.25 μm and have an operation voltage of 2.5 V, and the HVMOS transistors 6 and 7, which have an operation voltage of 20 V, are mixedly mounted.

Figure 4A:
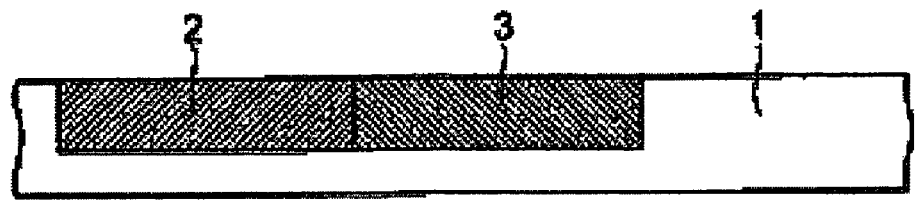
FIGS. 4A to 4D are cross sectional diagrams in a step order of the embodiment of FIG. 1 of the present invention.

The HVNwell 2 used for forming the HVPMOS transistors 7, and the HVPwell 3 used for forming the HVNMOS transistors 6 are formed on the p-type Si substrate 1 as shown in FIG. 4A. The depth of the HVNwell 2 depends on the operation voltage of the high voltage transistor used. The HVPwell 2 and the HVNwell 3 having a junction depth on the order of 4 μm with respect to a withstand voltage of 20 V are formed this time. The junction depth differs between the LVPwell 5 and the LVNwell 4 etc., and therefore they cannot also be formed at the same time here.

Figure 4B:
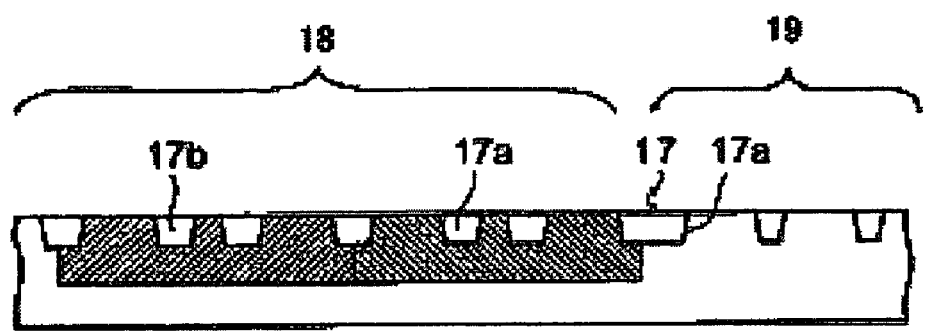

The shallow trenches 17a used for the STIs 17 of the element isolation region are formed next as shown in FIG. 4B. The STIs 17 used for the HVMOS transistors 6 and 7, and the STIs 17 used for the LVMOS transistors 8 and 9, which have a microscopic structure, have the same depth, and are formed at the same time. The shallow trenches 17a are formed independently in the HV region 18 so as to surround each of the HVMOS transistors 6 and 7. That is, the two shallow trenches 17a are formed between two adjacent HVMOS transistors 6 and 7, sandwiching the surface of the HVNwell 2 or the surface of the HVPwell 3. Further, the shallow trenches 17a are formed so as to surround the LVMOS transistors 8 and 9 in the LV region 19. However, a point of difference with the HV region 18 is that the surface of the LVNwell 4 and the LVPwell 5 is not exposed between the shallow trenches 17a that surround two adjacent LVMOS transistors 8 and 9. The depth of the shallow trenches 17a is from 2000 Å to 5000 Å. In addition, the dielectric 17b is embedded in each of the shallow trenches 17a, forming the STIs 17. Note that the dielectric films 17b are formed of a silicon oxide film, a silicon nitride film, a BPSG film, or a laminate film of these films.

Figure 4C:
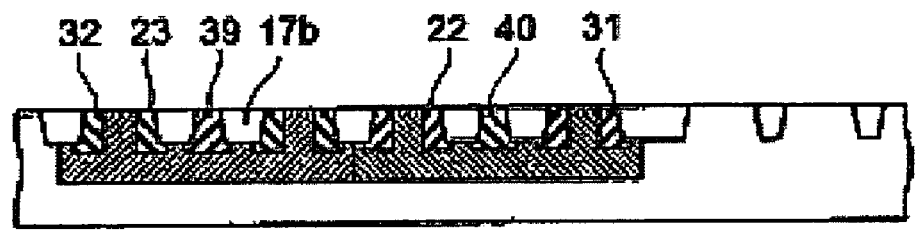

Next, as shown in FIG. 4C, an n-type impurity is ion-implanted through the dielectric films 17b of the STIs 17 using a mask to form the n-type low impurity concentration source and drain regions 31 of the HVNMOS transistor 6 and the HVN+ channel cut layer 39 of the HVNwell 2. In addition, a p-type impurity is ion-implanted through the dielectric films 17b of the STIs 17 using a mask to form the p-type low impurity concentration source and drain regions 32 of the HVPMOS transistors 7 and a HVP+ channel cut region 40 of the HVPwell 3. The n-type low impurity concentration source and drain regions 31, and the p-type low impurity concentration source and drain regions 32 may be formed with a larger depth than the STIs 17 as in FIG. 1, and may also be formed with a smaller depth than the STIs 17. Note that the effects of the present invention can be obtained even if the HVN+ channel cut layer 39 and HVP+ the channel cut region 40 are not formed.

Figure 4D:
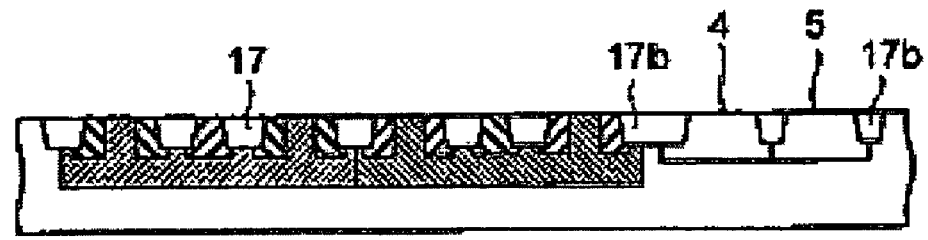

In addition, impurities are doped through the dielectric films 17b of the STIs 17 to form the LVNwell 4 and the LVPwell 5 used for the LVMOS transistors 8 and 9, as shown in FIG. 4D. The junction depths of the LVNwell 4 and the LVPwell 5 are approximately 1 μm.

Figure 5A:
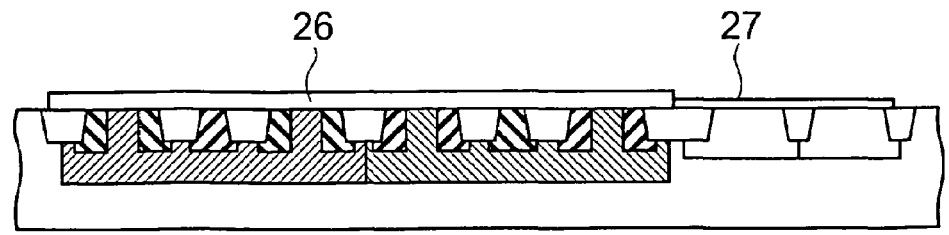
FIGS. 5A to 5D are cross sectional diagrams in a step order of processes after those shown in FIGS. 4A to 4D.

In addition, the thick HV gate oxide film 26 used for the HVMOS transistors 6 and 7 is formed with a thickness on the order of. 700 Å, and after removing only the thick HV gate oxide film 26 of the LV region 19, the thin LV gate oxide film 27 used for the LVMOS transistors 8 and 9 is formed on the LV region 19 with a thickness on the order of 50 Å, as shown in FIG. 5A.

Figure 5B:
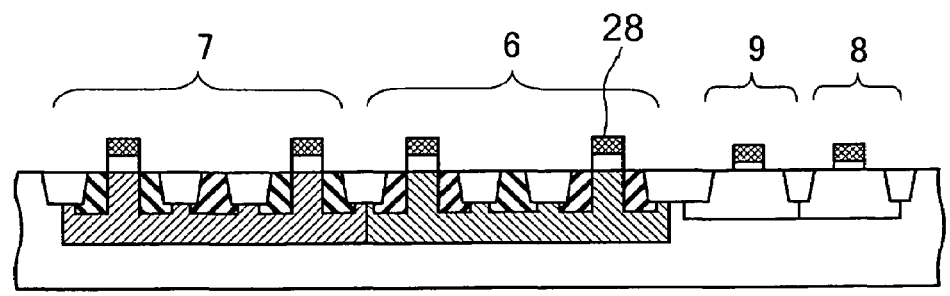

The gate electrodes 28 of each of the MOS transistors 6, 7, 8, and 9 are then patterned and formed as shown in FIG. 5B.

Figure 5C:
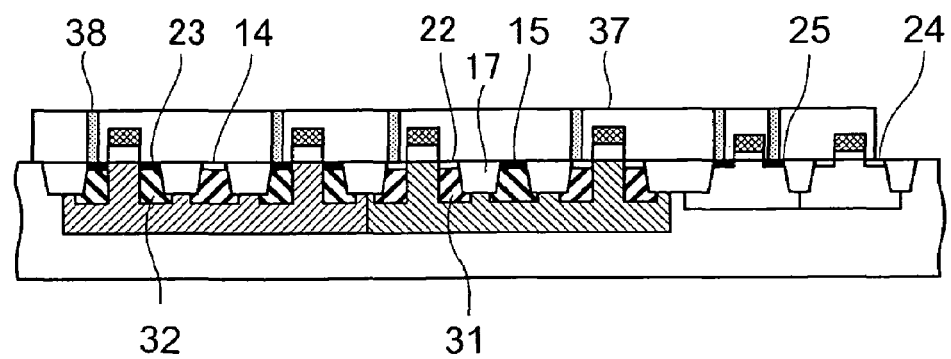

The n-type high impurity concentration source and drain regions 22 of the HVNMOS transistor 6, the HVN++ channel cut region 14 formed on the surface of the HVNwell 2 region and sandwiched between two STIs 17, and source and drain regions 24 of the LVNMOS transistor 8 are then formed at the same time using a mask through ion injection, as shown in FIG. 5C. In addition, the p-type high impurity concentration source and drain regions 23 of the HVPMOS transistor 7, the HVP++ channel cut layer 15 formed on the surface of the HVPwell 3 region and sandwiched between two STIs 17, and the source and drain regions 25 of the LVPMOS transistor 9 are then formed at the same time using a mask through ion injection. Low impurity concentration impurity doping is performed by ion injection of As (arsenic) on the order of up to $10^{15}/cm^2$ for the n-type impurity, and B (boron) or $BF_2$ (boron fluoride) on the order of up to $10^{15}/cm^2$ for the p-type impurity.

The low impurity concentration source and drain regions 31 and 32 are formed in the HVMOS transistors 6 and 7, respectively, in this embodiment, and the source and drain regions 24 and 25 of the LVMOS transistors, respectively, and the high impurity concentration source and drain regions 22 and 23 of the HVMOS transistors 6 and 7, respectively, may be formed at the same time. The contact 38 is then formed in order to connect the interlayer insulating film 37 formed of the PSG film, the BPSG film, or the like, and the elements.

Figure 5D:
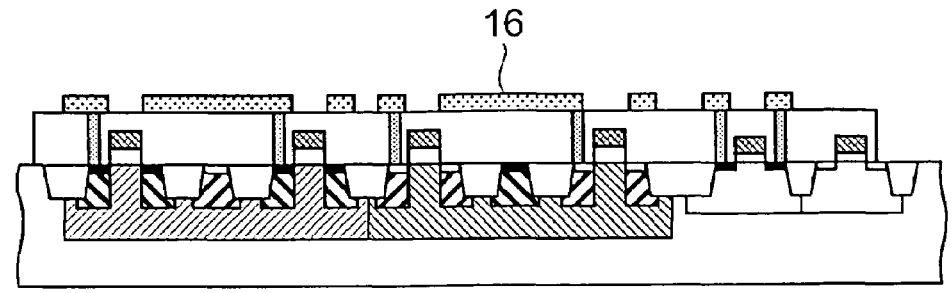

The metallic wirings 16 can be disposed freely as in FIG. 5D. The figure shows formation of the wirings 16 so as to straddle the channel cut regions.

FIGS. 6A to 6D are cross sectional diagrams of another embodiment. There is a case of disposing the wirings made of polysilicon (polycide or suicide), which constitute the same layer as the gate electrodes, on the element isolation region. In this case, the STIs 17 are structurally the same as those of FIG. 1, but the polysilicon wirings are formed on the element isolation region and the high impurity concentration HVN++ channel cut region 14 and the high impurity concentration HVP++ channel cut region 15 are formed by ion implantation through the polysilicon wirings. Therefore, the ions are not injected under the polysilicon layer and the channel cut regions cannot be formed by the processes shown in FIGS. 4A to 4D and 5A to 5D.

Processing up to the step of FIG. 4B is the same. Next, the LVN well 4 and the LVP well 5 are formed by ion injection through the dielectrics 17b of the STIs 17 using a mask, as in FIG. 6A.

Figure 6A:
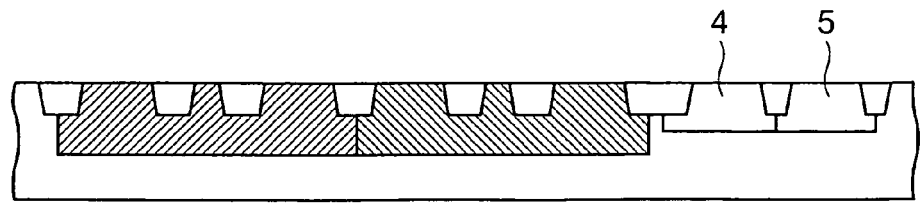
FIGS. 6A to 6D are cross sectional diagrams in a step order in another case.
Figure 6B:
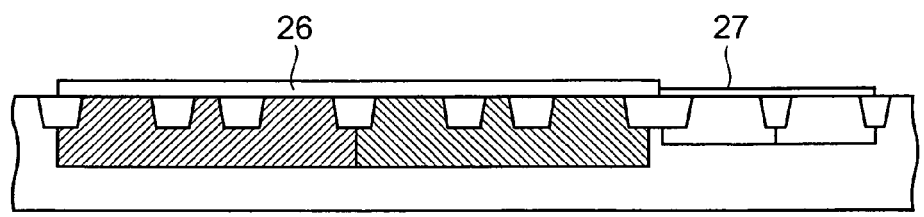
Figure 6C:
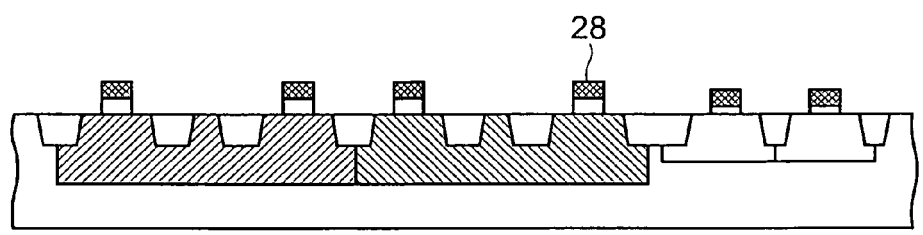
Figure 6D:
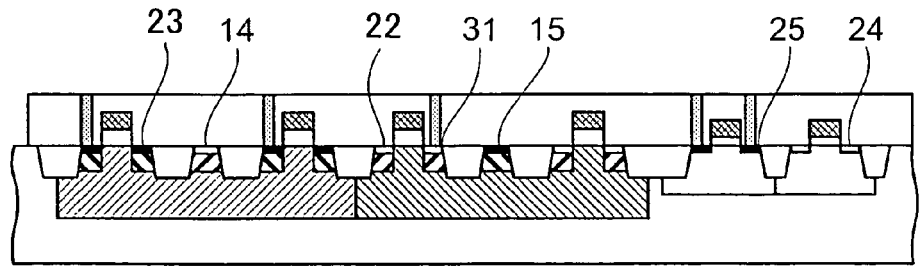

The HV gate oxide film 26 and the LV gate oxide film 27 are formed as in FIG. 6B, after which the gate electrodes 28 are formed, and wirings are formed simultaneously when the gate electrodes 28 are formed, as in FIGS. 6B and 6C. The wirings may be wirings that straddle the channel cut regions. The low impurity concentration source and drain regions 31 of the HVNMOS transistor, the low impurity concentration source and drain regions 32 of the HVPMOS transistor, the high impurity concentration source and drain regions 22 of the HVNMOS transistor, the high impurity concentration source and drain regions 23 of the HVPMOS transistor, the LVNMOS source and drain regions 24, the LVPMOS source and drain regions 25, the interlayer insulating film 37, and the contact 38 are then formed, as in FIG. 6D. Another metallic wiring 16 is then formed.

Further, a cross sectional diagram of another embodiment is presented, although not explained with reference to the figure. The cross sectional shapes of the shallow trenches 17a of the STIs 17 formed in the HV region 18 and the LV region 19 differ, and the incline of the shallow trench 17a of the HV region is relatively gentle (flat), while the slope of the shallow trench 17a of the LV region 19 has a steep angle (standing). That is, it is necessary to form the shallow trenches 17a separately. This is made in order to attain the satisfactory performance of the element isolation of the HV region 18. The STIs 17 are used in order to make the element isolation region smaller. There are cases where a desired voltage cannot be obtained because the electric field of the ends of the active region becomes strong for cases of manufacturing high voltage (HV) transistors. The slope of the STIs 17 of the HV region 18 is made gentle in this embodiment, while the shape of the STIs 17 of the LV region 19 is changed.

Figure 7:
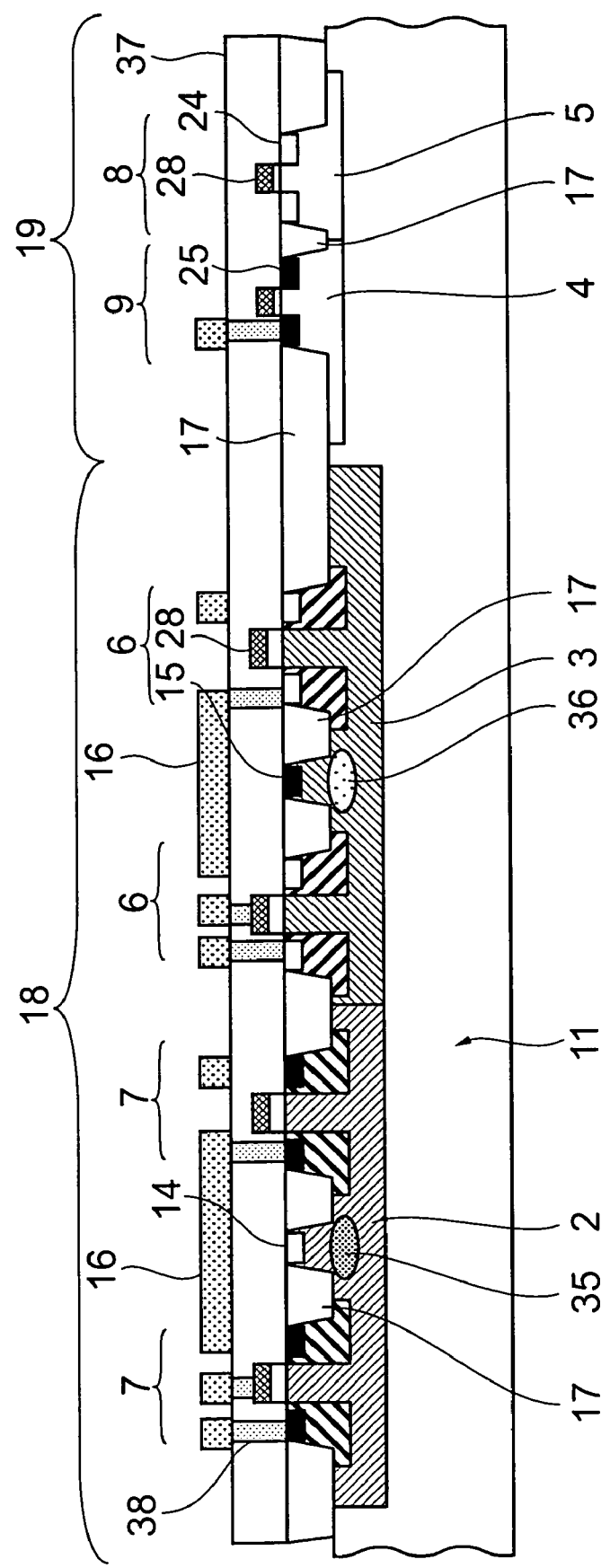
FIG. 7 is a cross sectional diagram of another embodiment of the present invention.

Further, FIG. 7 is a cross sectional diagram of the structure of yet another embodiment. Compared to the embodiment of FIG. 1, this is an embodiment in which an n-type punch-through blocking region 35 and a p-type punch-through blocking region 36 are formed: under the HVN++ channel cut region 14, which is sandwiched by two STIs 17, and the HVP++ channel cut layer 15, which is sandwiched by two STIs 17, respectively; and under the low impurity concentration HVN+ channel cut layer 39 having a relatively high impurity concentration and the low impurity concentration HVP+ channel cut region 40 having a relatively high impurity concentration, respectively.

In accordance with the present invention, element isolators of HVNMOS transistors and HVPMOS transistors become more compact than Locos element isolators because two STIs are formed, and a channel cut region is formed on a surface portion of a well sandwiched between the two STIs. Further, doping for the channel cut region is performed at the same time as the impurity doping process for the source and drain regions of the MOS transistors, and therefore the process becomes simple. The impurity introduction for the channel cut region becomes simple as compared to the case of forming one STI and a channel cut region thereunder, and costs are reduced.

What is claimed is:

1. A semiconductor device comprising:
   a semiconductor substrate;
   a first well and a second well formed on the semiconductor substrate;
   a plurality of high voltage MOS transistors formed in the first well;
   a plurality of low voltage MOS transistors having gate lengths in a sub-micron order, the low voltage MOS transistors being formed in the second well;
   a first shallow trench isolation comprised of a first shallow trench disposed as an element isolator on a surface of a low voltage region of the semiconductor substrate on which the low voltage MOS transistors are formed, and a first dielectric embedded in the first shallow trench;
   a second shallow trench isolation comprised of two second shallow trenches disposed at an interval between a source region or a drain region of a first of the high voltage MOS transistors and a source or a drain region of a second of the high voltage MOS transistors as element isolators on a surface of a high voltage region of the semiconductor substrate on which the plurality of high voltage MOS transistors are formed, and a second dielectric embedded in each of the second shallow trenches; and
   a first channel cut region having a high impurity concentration disposed on the surface of the substrate between the two second shallow trenches of the second shallow trench isolation.

2. A semiconductor device according to claim 1; wherein the two second shallow trenches of the second shallow trench isolation are formed so as to surround the high voltage MOS transistors.

3. A semiconductor device according to claim 2; wherein the first channel cut region is disposed so as to surround the high voltage MOS transistors.

4. A semiconductor device according to claim 1; wherein the first channel cut region is disposed between two mutually adjacent high voltage MOS transistors of the plurality of high voltage MOS transistors.

5. A semiconductor device according to claim 1; wherein the first well has a surface disposed between the two second shallow trenches.

6. A semiconductor device according to claim 5; wherein a second channel cut region having a low impurity concentration is formed on the surface of the first well disposed between the two second shallow trenches.

7. A semiconductor device according to claim 6; wherein the first channel cut region is formed on the second channel cut region.

8. A semiconductor device comprising:
   a semiconductor substrate having a high voltage region and a low voltage region;
   a first well formed in the high voltage region of the semiconductor substrate;
   a second well formed in the low voltage region of the semiconductor substrate;
   at least a pair of adjacent high voltage MOS transistors disposed in the first well;
   a plurality of low voltage MOS transistors disposed in the second well;
   a first element isolator comprised of a first shallow trench disposed on a surface of the low voltage region of the semiconductor substrate, and a first dielectric embedded in the first shallow trench;
   a pair of second element isolators comprised of two second shallow trenches spaced apart at an interval between a source region or a drain region of one of the pair of the adjacent high voltage MOS transistors and a source or a drain region of the other of the pair of the adjacent high voltage MOS transistors, the second shallow trenches being disposed on a surface of the high voltage region of the semiconductor substrate, and a second dielectric embedded in each of the second shallow trenches; and
   a first channel cut region having a high impurity concentration disposed on the surface of the substrate between the second shallow trenches.

9. A semiconductor device according to claim 8; wherein the second shallow trenches surround the high voltage MOS transistors.

10. A semiconductor device according to claim 9; wherein the first channel cut region surrounds the high voltage MOS transistors.

11. A semiconductor device according to claim 8; wherein the low voltage MOS transistors have gate lengths in a sub-micron order.

12. A semiconductor device according to claim 8 wherein the first well has a surface disposed between the two second shallow trenches.

13. A semiconductor device according to claim 12; wherein a second channel cut region having a low impurity concentration is formed on the surface of the first well disposed between the two second shallow trenches.

14. A semiconductor device according to claim 13; wherein the first channel cut region is formed on the second channel cut region.

* * * * *